(12) United States Patent
Cheng et al.

(10) Patent No.: US 8,673,708 B2
(45) Date of Patent: Mar. 18, 2014

(54) REPLACEMENT GATE ETSOI WITH SHARP JUNCTION

(75) Inventors: Kangguo Cheng, Schenectady, NY (US); Bruce B. Doris, Brewster, NY (US); Balasubramanian S. Haran, Watervliet, NY (US); Ali Khakifirooz, Mountview, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,044

(22) Filed: Sep. 12, 2012

(65) Prior Publication Data

US 2013/0034938 A1    Feb. 7, 2013

Related U.S. Application Data

(63) Continuation of application No. 13/195,153, filed on Aug. 1, 2011.

(51) Int. Cl.
*H01L 21/338*    (2006.01)

(52) U.S. Cl.
USPC ........... 438/183; 438/151; 438/159; 438/161; 438/300; 257/E21.444; 257/E21.453

(58) Field of Classification Search
USPC .................. 438/183, 151, 159, 161, 300; 257/E21.444, E21.453
See application file for complete search history.

(56) References Cited

U.S. PATENT DOCUMENTS

| | | | |
|---|---|---|---|
| 5,937,293 A | 8/1999 | Lee | |
| 6,127,233 A * | 10/2000 | Rodder | 438/300 |
| 6,660,598 B2 * | 12/2003 | Hanafi et al. | 438/291 |
| 6,774,000 B2 | 8/2004 | Natzle et al. | |
| 6,815,297 B1 * | 11/2004 | Krivokapic et al. | 438/287 |
| 7,064,039 B2 | 6/2006 | Liu | |
| 7,429,769 B2 | 9/2008 | Diaz et al. | |
| 2002/0068409 A1 | 6/2002 | Chou et al. | |
| 2006/0157797 A1 * | 7/2006 | Tateshita | 257/369 |
| 2007/0007590 A1 * | 1/2007 | Kinoshita et al. | 257/336 |
| 2007/0287259 A1 | 12/2007 | Kavalieros et al. | |
| 2008/0173947 A1 | 7/2008 | Hou et al. | |
| 2008/0258216 A1 * | 10/2008 | Kikuchi | 257/344 |

OTHER PUBLICATIONS

Riyadi et al. "The Future of Non-Planar Nanoelectronics MOSFET Devices: A Review", Journal of Applied Sciences, 2010.
Cheng et al. "Extremely Thin SOI (ETSOI) CMOS with Record Low Variability for Low Power System-on-Chip Applications", Jun. 2009, IEEE IEDM09-49.

(Continued)

*Primary Examiner* — Anthony Ho
*Assistant Examiner* — David Chen
(74) *Attorney, Agent, or Firm* — Harrington & Smith

(57) ABSTRACT

A method includes providing a silicon-on-insulator wafer (e.g., an ETSOI wafer); forming a sacrificial gate structure that overlies a sacrificial insulator layer; forming raised source/drains adjacent to the sacrificial gate structure; depositing a layer that covers the raised source/drains and that surrounds the sacrificial gate structure; and removing the sacrificial gate structure leaving an opening that extends to the sacrificial insulator layer. The method further includes widening the opening so as to expose some of the raised source/drains, removing the sacrificial insulator layer and forming a spacer layer on sidewalls of the opening, the spacer layer covering only an upper portion of the exposed raised source/drains, and depositing a layer of gate dielectric material within the opening. A gate conductor is deposited within the opening.

10 Claims, 6 Drawing Sheets

(56) References Cited

OTHER PUBLICATIONS

Uchino et al. "A Raised Source/Drain Technology Using In-situ P-doped SiGe and B-doped Si for 0.1 um CMOS ULSIs", IEEE 1997, 0-78803-4100-7/97.

Waite et al., "Raised Source/Drain (RSD) for 50 nm MOSFETs-Effect of Epitaxy Layer Thickness on Short Channel Effects", 2003 IEEE, 0-7803-7999 3/03.

Natzle et al., "Trimming of Hard-Masks by Gaseous Chemical Oxide Removal (COR) for Sub-10nm Gates/Fins, for Gate LengthControl and for Embedded Logic", 2004 IEEE/SEMI Advanced Semiconductor Manufacturing Conference.

Doris et al., "Ultra-Thin SOI Replacement Gate CMOS with ALD TaN/High-k Gate Stack", 2005 IEEE, 0-7803-9058-X/05.

Lammers, "COMOS Transitions to 22 and 15 nm", Semiconductor International Jan. 1, 2010.

\* cited by examiner

REPLACEMENT GATE ETSOI WITH SHARP JUNCTION

CROSS-REFERENCE TO A RELATED PATENT APPLICATION

This patent application is a continuation application of copending U.S. patent application Ser. No. 13/195,153, filed Aug. 1, 2011, the disclosure of which is incorporated by reference herein in its entirety.

TECHNICAL FIELD

The exemplary embodiments of this invention relate generally to semiconductor devices and fabrication techniques and, more specifically, relate to the fabrication of semiconductor transistor devices, such as field effect transistors (FETs) used in random access memory (RAM) and logic circuitry, using an extremely thin silicon on insulator (ET-SOI) substrate, also referred to as a fully-depleted silicon on insulator (FDSOI) substrate.

BACKGROUND

In silicon on insulator (SOI) technology a thin silicon layer is formed over an insulating layer, such as silicon oxide, which in turn is formed over a bulk substrate. This insulating layer is often referred to as a buried oxide (BOX) layer or simply as a BOX. Sources and drains of field effect transistors (FETs) are formed by the addition of N-type and/or P-type dopant material into the thin silicon layer, with a channel region being disposed between the source and drain.

SUMMARY

In accordance with the exemplary embodiments of this invention there is provided a method to fabricate a structure. The method includes providing a wafer comprising a semiconductor substrate having a top surface, an insulating layer disposed over the top surface and a semiconductor layer disposed over the insulating layer. The method further includes forming on the semiconductor layer a sacrificial gate structure that overlies a sacrificial insulator layer; forming a raised source and a raised drain on the semiconductor layer adjacent to the sacrificial gate structure; depositing a layer that covers the raised source and the raised drain and that surrounds the sacrificial gate structure; removing the sacrificial gate structure leaving an opening in the layer that extends to the sacrificial insulator layer; selectively removing a portion of the layer to widen the opening in the oxide layer so as to expose some but not all of the raised source and the raised drain that are adjacent to the exposed semiconductor layer. In this method selectively removing also removes the sacrificial insulator layer to expose the underlying semiconductor layer. The method further includes forming a spacer layer on sidewalls of the opening, the spacer layer covering only an upper portion of the exposed raised source and the raised drain, leaving still exposed a lower portion of the raised source and raised drain that are adjacent to the exposed semiconductor layer. The method further includes depositing a layer of gate dielectric material within the opening so as cover the spacer layer, the exposed portion of the semiconductor layer, and the exposed lower portion of the raised source and the raised drain; and depositing a gate conductor within the opening and over the layer of gate dielectric material.

Still further in accordance with the exemplary embodiments of this invention there is provided a method that includes providing a silicon-on-insulator wafer (e.g., an ETSOI wafer); forming a sacrificial gate structure that overlies a sacrificial insulator layer; forming raised source/drains adjacent to the sacrificial gate structure; depositing a layer that covers the raised source/drains and that surrounds the sacrificial gate structure; and removing the sacrificial gate structure leaving an opening that extends to the sacrificial insulator layer. The method further includes widening the opening so as to expose some of the raised source/drains, removing the sacrificial insulator layer and forming a spacer layer on sidewalls of the opening, the spacer layer covering only an upper portion of the exposed raised source/drains, and depositing a layer of gate dielectric material within the opening. A gate conductor is deposited within the opening.

BRIEF DESCRIPTION OF THE SEVERAL VIEWS OF THE DRAWINGS

FIG. 8A shows the fabrication of a gate dielectric and gate metal in the structure formed by the process of FIGS. 1-7, while FIGS. 8A and 8B may be collectively referred to as FIG. 8.

DETAILED DESCRIPTION

ETSOI has become a viable device option for continued scaling of CMOS technology. One challenge for fabricating ETSOI is to achieve a sharp junction and low extension resistance. It is desirable to provide a sharp, well-defined junction to achieve good short-channel control. A sharp junction can be formed by implantation of a suitable dopant species. However, implantation tends to damage the ETSOI layer and can result in an increased extension resistance. The junction can also be formed by a thermally-driven diffusion of dopant species which avoids damaging the ETSOI layer. However, the diffusion process can be difficult to control to achieve the desired sharp, well-defined junction.

The exemplary embodiments of this invention provide a method for forming an ETSOI device (e.g., a FET device) with a sharp junction and a low extension resistance through the use of a replacement gate process. The embodiments of this invention also encompass a structure that is fabricated in accordance with the method.

Figure 1:
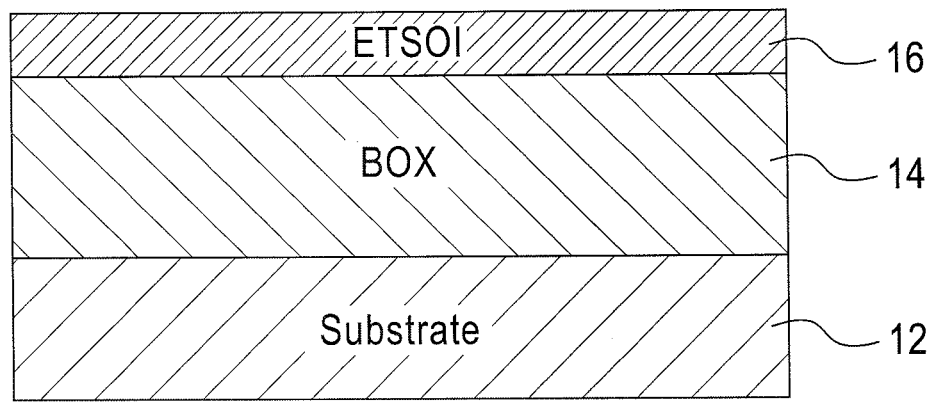
FIGS. 1-7 each present a cross-sectional enlarged view (not to scale) of a portion of an ETSOI wafer and depict the execution of sequentially performed transistor processing and fabrication steps.

FIG. 1 shows an enlarged cross-sectional view of a small portion of a starting wafer structure 10. The wafer structure 10 includes a semiconductor (e.g., Si) substrate 12, an electrically insulating layer which can be referred to as a buried oxide (BOX) layer 14 and a thin Si top layer, also referred to as an ETSOI layer 16 or simply as an ETSOI. The substrate 12 can be, for example, a p-type Si substrate and can have any suitable thickness. The BOX 14 can have a thickness in a range of, by example, about 10 nm to about 200 nm. The ETSOI layer 16 can have a thickness in a range of about 5 nm to about 12 nm, with about 6 nm-7 nm being a suitable thickness for many applications of interest.

Figure 2:
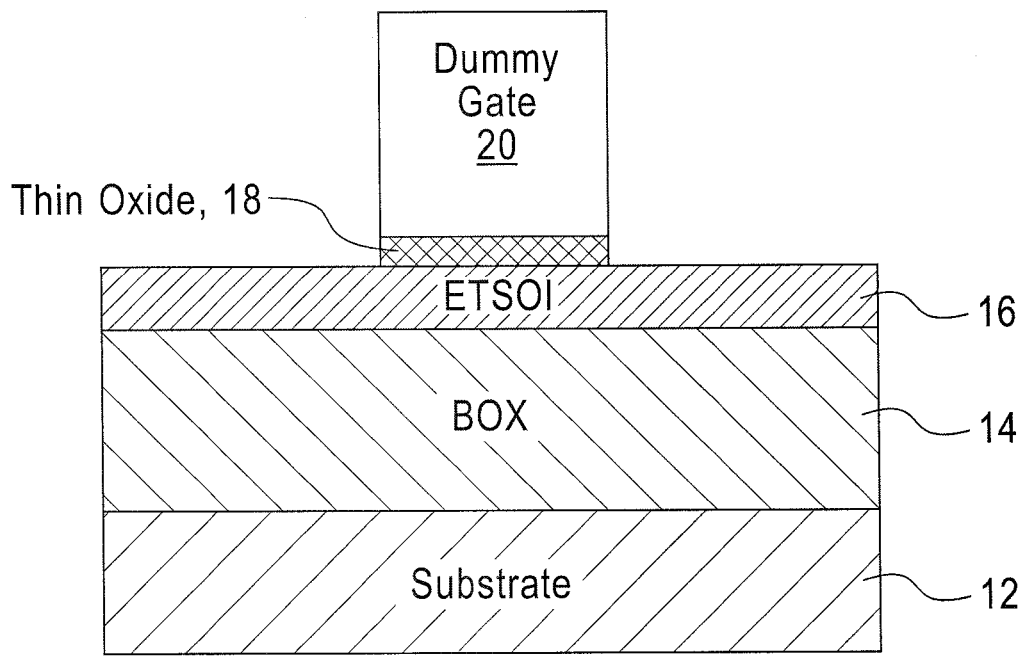

FIG. 2 shows a thin oxide layer 18 that is grown over the ETSOI layer 16 (dummy gate oxide layer) and a dummy gate structure 20 that is formed atop the oxide layer 18. The oxide layer 18 may have a thickness in a range of about 1 nm to about 10 nm and may be a layer of $SiO_2$. The dummy gate structure 20 can be formed of silicon nitride ($Si_3N_4$) and can have a thickness in a range of about 25 nm to about 100 nm, or more preferably in a range of about 30 nm to about 70 nm, and a width in the range of about 15 nm to about 35 nm. As will be made apparent below both the oxide layer 18 and the dummy gate structure 20 are sacrificial structures that are subsequently removed during processing. Before it is removed the oxide layer 18 will form an etch stop layer during a subsequent processing step shown in FIG. 5.

Figure 3:
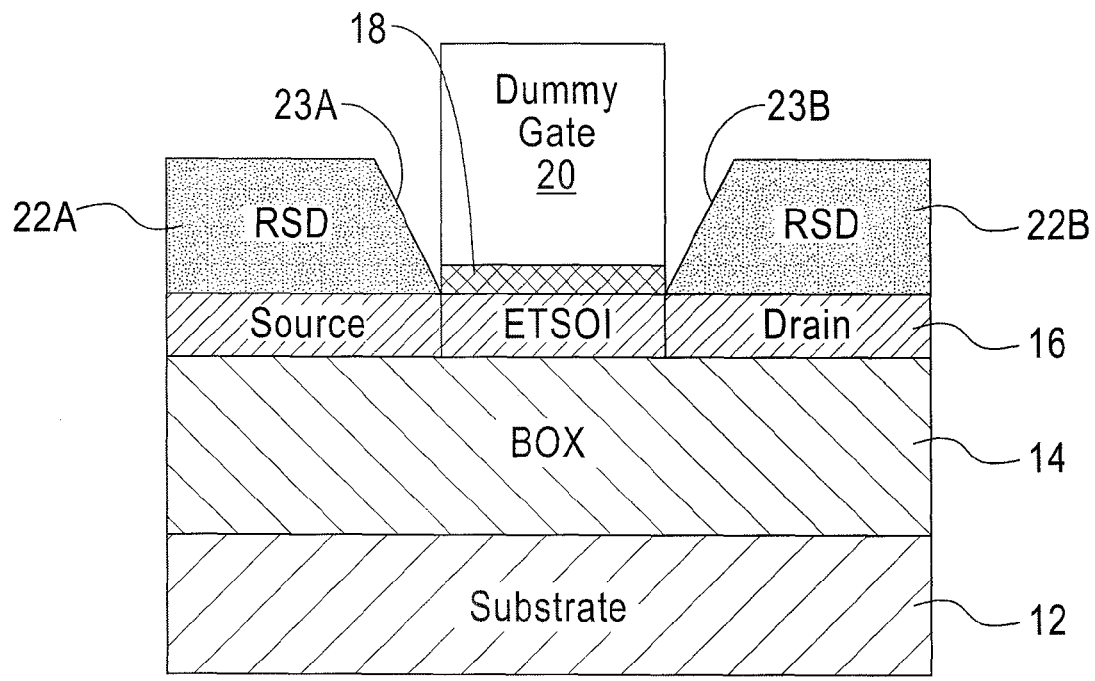

FIG. 3 shows a result of the formation of raised source/drain (RSD) structures 22A, 22B. The RSD structures 22A, 22B are preferably in-situ doped and may have a dopant atom concentration in a range of, for example, about $5 \times 10^{20}/cm^3$ to about $8 \times 10^{21}/cm^3$. The RSD structures 22A, 22B are formed by the epitaxial growth of silicon, such as by the use of a mixture of silane and dichlorosilane gases with a chemical vapor deposition (CVD) process. Phosphorus is one suitable n-type dopant, and Boron is one suitable p-type dopant. The epitaxial growth is preferential to Si and results, possibly in combination with an etching step performed during a cyclical epitaxial growth process, in a layer that exhibits facets 23A and 23B adjacent to the dummy gate 20.

The formation of in-situ doped RSD structures is well characterized in the art. For example, reference can be made to commonly owned U.S. Pat. No. 6,774,000, "Method of Manufacture of MOSFET Device with In-Situ Doped Raised Source and Drain Structures", Wesley C. Natzle et al., and to "A raised source/drain technology using in-situ P-doped SiGe and B-doped Si for 0.1-μm CMOS ULSIs", Takashi Uchino et al., Electron Devices meeting, 1997, IEDM '97. Technical Digest, International, 7-10 Dec 1997, pgs. 479-482. Reference can also be made to "Extremely Thin SOI (ETSOI) CMOS with Record Low Variability for Low Power System-on-Chip Applications", K. Cheng, A. Khakifirooz, P. Kulkarni, S. Ponoth, J. Kuss, D. Shahrjerdi, L. F. Edge, A. Kimball, S. Kanakasabapathy, K. Xiu, S. Schmitz, A. Reznicek, T. Adam, H. He, N. Loubet, S. Holmes, S. Mehta, D. Yang, A. Upham, S.-C. Seo, J. L. Herman, R. Johnson, Y. Zhu, P. Jamison, B. S. Haran, Z. Zhu, L. H. Vanamurth, S. Fan, D. Horak, H. Bu, P. J. Oldiges, D. K. Sadana, P. Kozlowski, D. McHerron, J. O'Neill, B. Doris, Solid-State Circuits Conference Digest of Technical Papers (ISSCC), 2010 IEEE International Issue Date: 7-11 Feb. 2010 pgs. 152-153.

Figure 4:
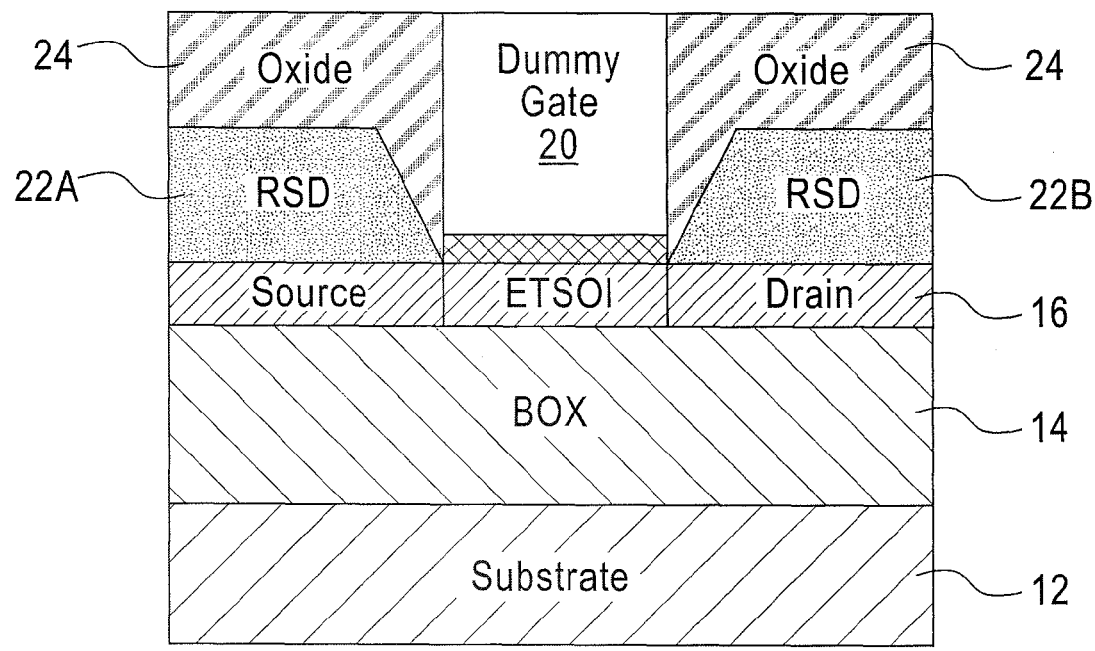

FIG. 4 shows a result of the deposition and subsequent planarization of a layer 24 (e.g., an oxide layer such as $SiO_2$). The layer 24 may be grown initially to a thickness that is about twice that of the dummy gate structure 20. A chemical mechanical polish (CMP) process is then used to planarize the layer 24, with the CMP process stopping on the nitride dummy gate structure 20.

Note that in some embodiments the layer 24 could be a nitride layer (e.g., $Si_3N_4$).

Figure 5:
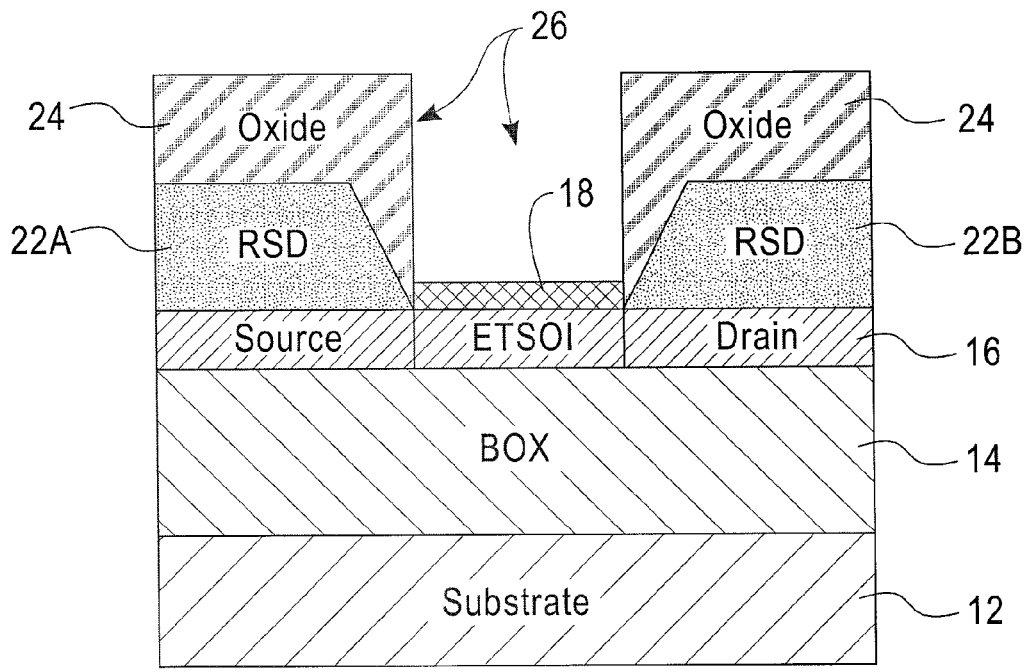

FIG. 5 shows a result of the selective removal of the dummy gate structure 20 to leave an opening 26 in the layer 24 that extends to the dummy gate oxide layer 18. Assuming that the dummy gate structure 20 is composed of silicon nitride ($Si_3N_4$) then any suitable wet or dry etch process for removing the nitride can be used. Preferably the process is selective to Si and $SiO_2$ so as to remove only the nitride "plug" that formed the dummy gate structure 20. For example, the dummy gate structure 20 can be removed using hot phosphoric acid (e.g., heated to a temperature of about 160° C. or greater) and/or a dry plasma etch process can be used.

Figure 6:
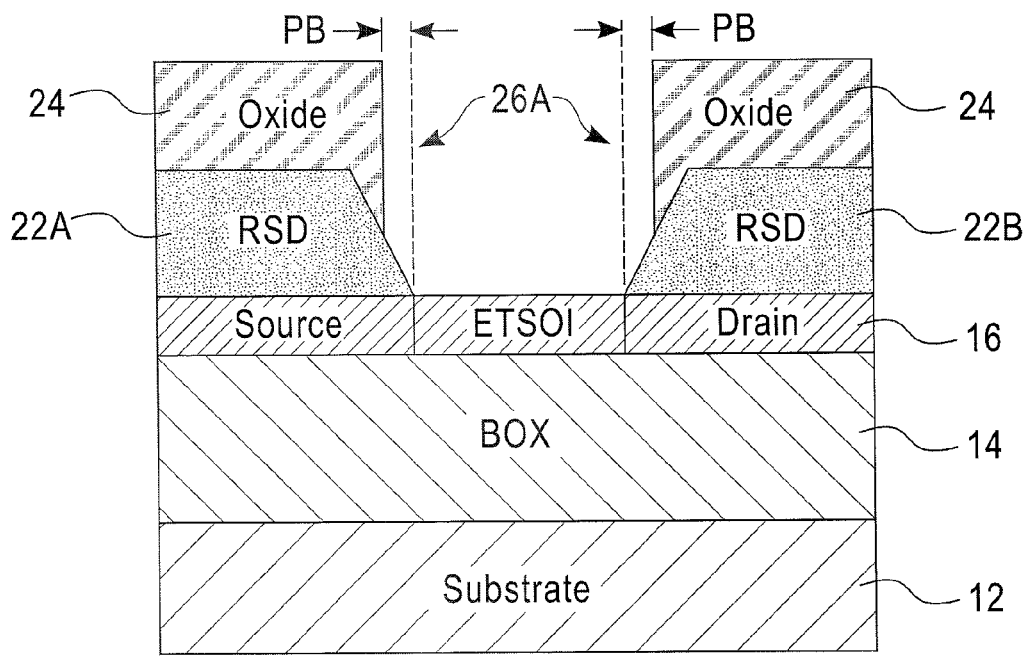

FIG. 6 shows a result of an oxide etch process that selectively removes the dummy gate oxide 18 and that also serves to enlarge the width of the opening 26, forming an enlarged opening 26A. The opening 26 is enlarged at each sidewall by what may be referred to for convenience as an oxide pull-back (PB) dimension. The PB dimension may be in a range of about 0.5 nm to about 6 nm. It can be noted that at this point in the processing the ETSOI is exposed as is a lower portion of the RSD 22 adjacent to the ETSOI. A chemical oxide removal process (COR) can be used to selectively remove only the oxide. Reference with regard to COR can be made to Natzle, W., Horak, D., Deshpande, S., Yu, C., Liu, J., Mann, R., Doris, B., et al. (2004), "Trimming of hard-masks by gaseous Chemical Oxide Removal (COR) for sub-10 nm gates/fins, for gate length control and for embedded logic", Advanced Semiconductor Manufacturing 2004 ASMC 04 IEEE Conference and Workshop (pp. 61-65). As is stated in this publication, basically the COR process is a gaseous, plasma-free/damage-free etch process that uses a mixture of HF and $NH_3$ in a ratio of approximately 2:1. Reaction is carried out at pressures below 15 m Torr at 25° C. to form solid ammonium hexafluorosilicate, followed by evaporation at a temperature greater than 100° C.

Note that if the layer 24 is a nitride layer the COR process can still be used; although it will typically proceed at a slower rate than if the layer 24 is an oxide layer.

Figure 7:
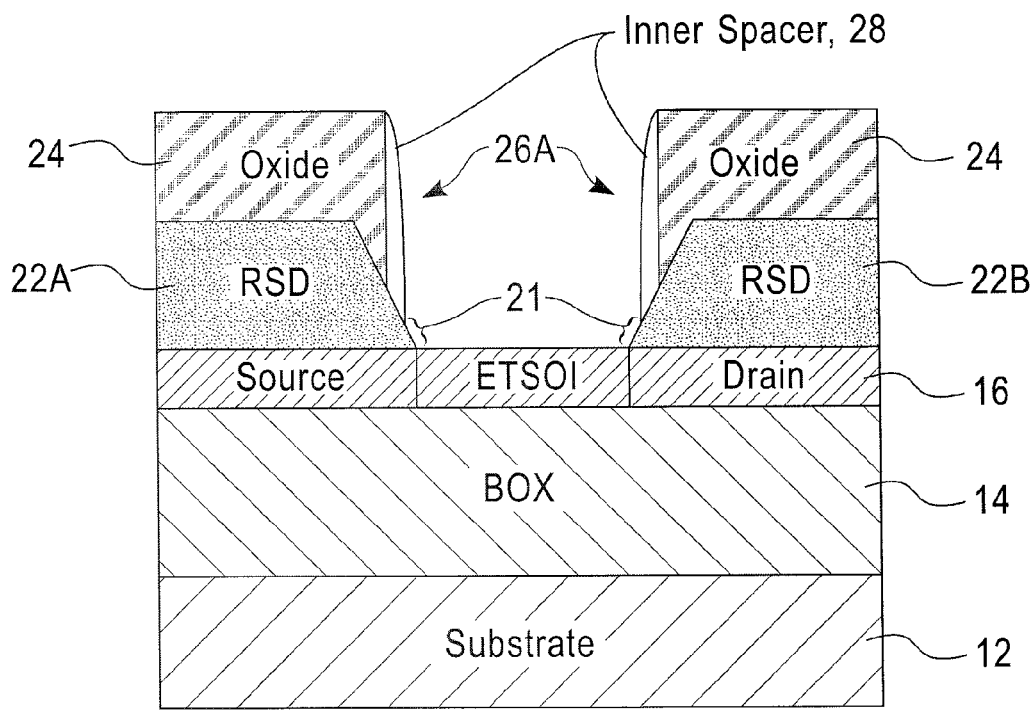

FIG. 7 shows a result of a deposition of a conformal silicon nitride ($Si_3N_4$) layer followed by an anisotropic ion etch that removes the conformal nitride layer from all horizontal surfaces (those surfaces normal or about normal to the etchant ion stream). The anisotropic etch leaves an inner silicon nitride spacer 28 on sidewalls of the opening 26A. Note that the ETSOI 16 at the bottom of the opening is exposed, which eventually will function as the channel of the resultant FET device, as is a lower portion 21 of the RSD 22 facet adjacent to the ETSOI.

Figure 8A:
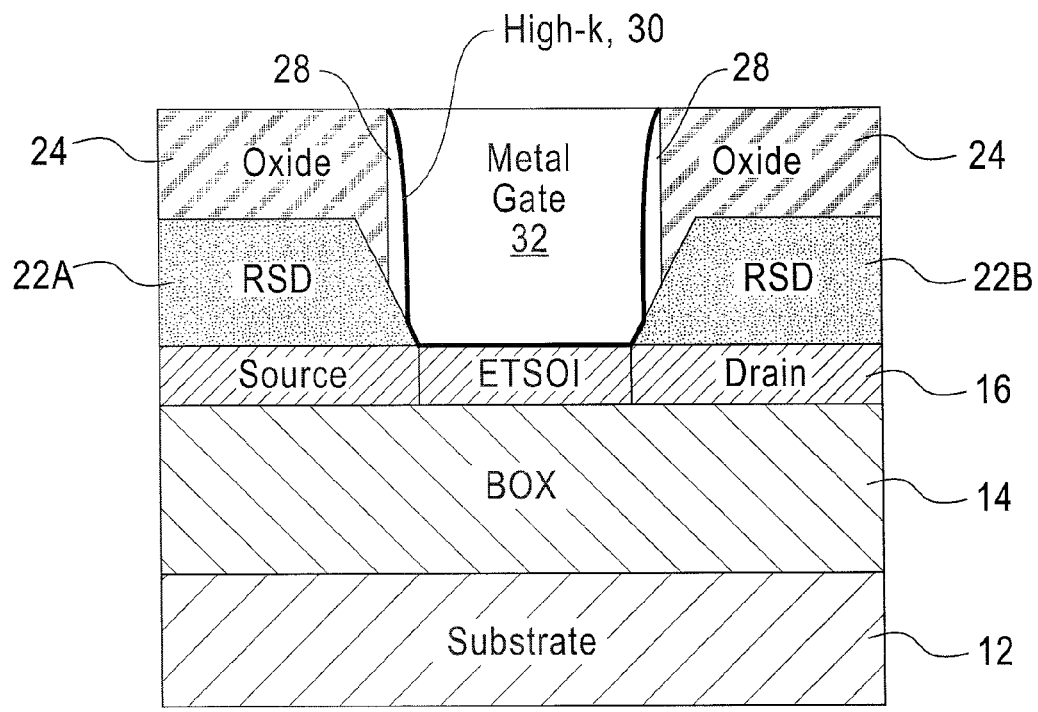

FIG. 8A shows a result of a deposition of a high dielectric constant (high-k), as compared to $SiO_2$, gate insulator layer 30 (e.g., thickness in a range of about 1 nm to about 3 nm) followed by deposition of a metal gate 32 to fill the opening 26A. The high-k gate insulator 30 may be any suitable material such as, but not limited to, hafnium silicate, zirconium silicate, hafnium dioxide and zirconium dioxide. These materials can be deposited using atomic layer deposition (ALD). The metal gate 32 can be formed of any suitable electrically conductive gate material including titanium nitride, aluminum nitride and tantalum nitride, as non-limiting examples. Note that in other embodiments the gate structure could be formed to include other materials such as an oxynitride for the gate insulator and polysilicon for the gate conductor.

Figure 8B:
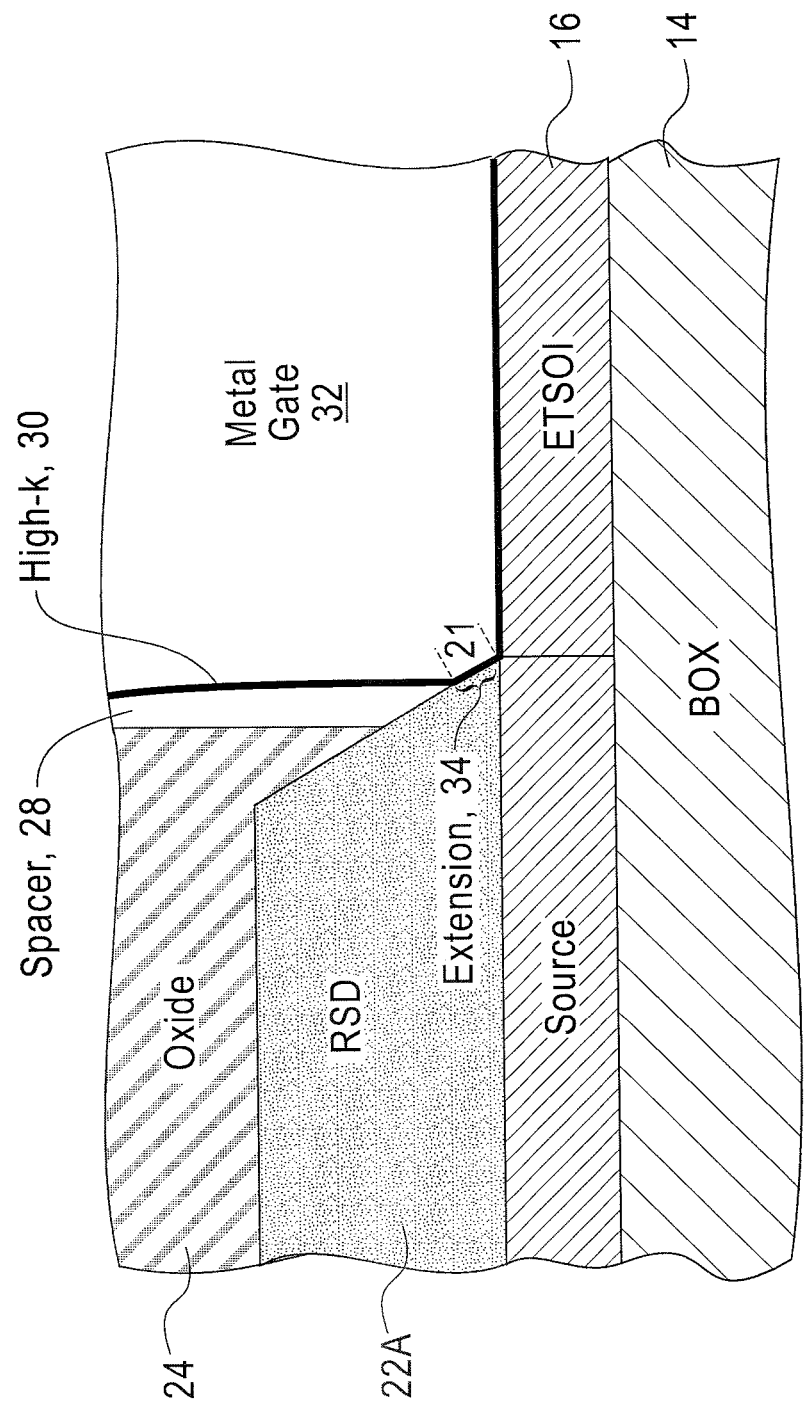
FIG. 8B is an enlarged view of a portion of the structure shown in FIG. 8B.

Reference is also made to FIG. 8B for showing an enlarged view of a portion of the structure shown in FIG. 8A. It can be seen that the portion 21 (an overlap portion or region) of the RSD 22 adjacent to the ETSOI is covered by the high-k layer 30 and the overlying metal gate 32. This overlap region defines a source-drain extension 34 and is characterized by a sharp and abrupt junction having reduced resistance (Rext). The source-drain extension 34 so formed avoids the ETSOI damage that can occur during an extension implant process, and furthermore is much more sharply defined than would be the case if the extension were formed by a thermally-driven dopant diffusion process.

The processing can also include a thermal diffusion step to drive dopants into the ETSOI layer underneath the RSD. Since the extension-gate overlap region is determined by the size of the gate hole and the inner spacer, the thermal diffusion process can be significantly reduced compared to the prior art case. A requirement of the doping profile in the RSD/ETSOI structure is that the dopants butt the buried oxide BOX 14.

The teachings of this invention can also be applied in the case of conventional Bulk/PDSOI or FinFET Tri Gate devices, where an in-situ doped RSD extension and replacement gate is used.

The area of the overlap portion or region 21 of the RSD 22 adjacent to the ETSOI, that is in contact with the high-k layer 30 and that underlies the metal gate 32, is preferably sized as a trade-off between capacitance and resistance. In general, the larger the area the higher will be the capacitance and the lower will be the resistance. Conversely, the smaller the area the lower will be the capacitance and the higher will be the resistance. One desirable goal is to achieve a value of capacitance and resistance that accommodates a desired minimum transistor turn-on and turn-off time (switching speed).

Processing (not illustrated) continues so as to form the needed source/drain and gate contact metallization and any other desired and conventional processes in order to complete the fabrication of the FET.

The various dopants and doping concentrations, layer thicknesses and specific materials discussed above are exemplary and can vary from those specifically described and shown.

Figure 9:
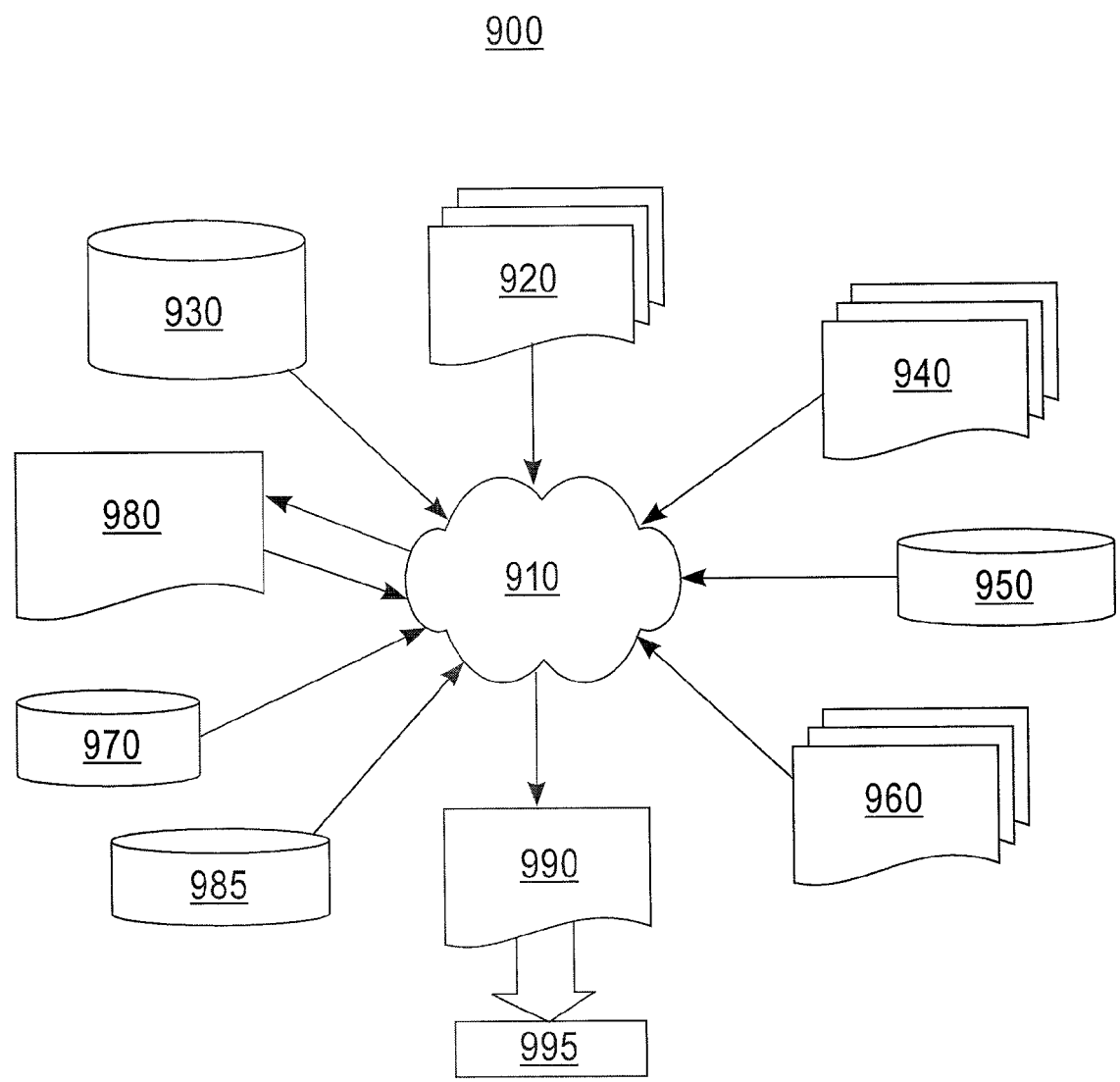
FIG. 9 shows a block diagram of an exemplary design flow used for example, in semiconductor IC logic design, simulation, test, layout, and manufacture.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer.

When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is re-synthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures).

Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the device shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements that may be found in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the various thicknesses, material types, dopant types and dopant concentrations are exemplary, and variations of the disclosed thicknesses, material types, dopant types and dopant concentrations may be attempted by those skilled in the art. However, all such and similar modifications of the teachings of this invention will still fall within the scope of this invention.

What is claimed is:

1. A method comprises:
   providing a silicon-on-insulator wafer;
   forming a sacrificial gate structure that overlies a sacrificial insulator layer;
   forming raised source/drains adjacent to the sacrificial gate structure;
   depositing a layer that covers the raised source/drains and that surrounds the sacrificial gate structure;
   removing the sacrificial gate structure in a first etch process to form an opening that extends to the sacrificial insulator layer;
   widening the opening in a second etch process that exposes at least some straight inclined surfaces of the raised source/drains and removes the sacrificial insulator layer;
   forming a spacer layer on sidewalls of the widened opening, the spacer layer covering only an upper ion of the exposed raised source drains; and
   depositing a layer of gate dielectric material within the widened opening;
   where forming raised source/drains results in forming a source facet and a drain facet that are upwardly sloping away from the sacrificial gate structure that overlies the sacrificial insulator layer, where areas of a lower portion of the source facet of the raised source and a lower portion of the drain facet of the raised drain covered by the layer of gate dielectric material define source-drain extension regions, and where the areas of the lower portions of the facets of the raised source and the raised drain are selected to optimize a tradeoff between capacitance and resistance of the source-drain extension regions.

2. The method as in claim 1, further comprising depositing a gate conductor within the widened opening.

3. The method as in claim 1, where a structure formed by the method is comprised of a FinFET.

4. The method as in claim 1, where the silicon-on-insulator wafer is an extremely n silicon-on-insulator wafer.

5. The method as in claim 1, where forming raised source/drains forms in-situ doped raised source/drains on the silicon-on-insulator wafer.

6. The method as claim 1, where the layer of gate dielectric material comprises a high dielectric constant material.

7. The method as in claim 2, where the gate conductor is a metal.

8. The method as in claim 1, where the layer that covers the raised source/drains and that surrounds the sacrificial gate structure is one of an oxide and a nitride.

9. The method as in claim 1, where widening the opening in a second etch process is accomplished using a chemical oxide removal process.

10. The method as in claim 1, where forming a spacer layer on sidewalls of the widened opening comprises depositing a conformal silicon nitride layer followed by an anisotropic etch that removes the conformal silicon nitride layer from horizontal surfaces leaving a silicon nitride spacer on the sidewalls of the widened opening.

* * * * *